United States Patent [19]

Gavalas et al.

[11] Patent Number: 5,453,298

[45] Date of Patent: Sep. 26, 1995

[54] METHOD FOR FORMING H2-PERMSELECTIVE OXIDE MEMBRANES

[75] Inventors: George R. Gavalas, Altadena, Calif.; Suk Woo Nam, Seoul, Rep. of Korea; Michael Tsapatsis, Pasadena, Calif.; Soojin Kim, West Orange, N.J.

[73] Assignee: California Institute of Technology, Pasadena, Calif.

[21] Appl. No.: 221,873

[22] Filed: Apr. 1, 1994

Related U.S. Application Data

[63] Continuation-in-part of Ser. No. 960,154, Oct. 13, 1992, abandoned, which is a continuation-in-part of Ser. No. 610,831, Nov. 8, 1990, abandoned.

[51] Int. Cl.[6] .......................... C23C 16/08; C23C 16/40; B01D 67/00; B01D 71/02
[52] U.S. Cl. ...................... 427/245; 427/243; 427/248.1; 427/255.3; 95/55; 96/10; 96/12
[58] Field of Search .................................. 427/243, 245, 427/255.3, 248.1; 55/16, 158

[56] References Cited

U.S. PATENT DOCUMENTS

| | | |
|---|---|---|
| 3,957,559 | 5/1976 | Hoffman, Jr. . |
| 4,197,148 | 4/1980 | Shinomura . |
| 4,483,694 | 11/1984 | Takamura et al. . |
| 4,619,866 | 10/1986 | Smith et al. . |
| 4,719,093 | 1/1988 | Falk et al. . |
| 4,877,651 | 10/1989 | Dory . |
| 4,902,307 | 2/1990 | Gavalas et al. . |
| 5,212,050 | 5/1993 | Mier et al. . |

OTHER PUBLICATIONS

Bunshah, R. F., Deposition Technologies For Films and Coatings, Noyes Publications, pp. 7–8, 1982.

Primary Examiner—Shrive Beck
Assistant Examiner—Bret Chen
Attorney, Agent, or Firm—F. Eugene Logan

[57] ABSTRACT

Methods of forming permselective oxide membranes that are highly selective to permeation of hydrogen by chemical deposition of reactants in the pore of porous tubes, such as Vycor™ glass or $Al_2O_3$ tubes. The porous tubes have pores extending through the tube wall. The process involves forming a stream containing a first reactant of the formula $RX_n$, wherein R is silicon, titanium, boron or aluminum, X is chlorine, bromine or iodine, and n is a number which is equal to the valence of R; and forming another stream containing water vapor as the second reactant. Both of the reactant streams are passed along either the outside or the inside surface of a porous tube and the streams react in the pores of the porous tube to form a nonporous layer of R-oxide in the pores. The membranes are formed by the hydrolysis of the respective halides. In another embodiment, the first reactant stream contains a first reactant having the formula $SiH_nCl_{4-n}$ where n is 1, 2 or 3; and the second reactant stream contains water vapor and oxygen. In still another embodiment the first reactant stream containing a first reactant selected from the group consisting of $Cl_3SiOSiCl_3$, $Cl_3SiOSiCl_2OSiCl_3$, and mixtures thereof and the second reactant stream contains water vapor. In still another embodiment, membrane formation is carried out by an alternating flow deposition method. This involves a sequence of cycles, each cycle comprising introduction of the halide-containing stream and allowance of a specific time for reaction followed by purge and flow of the water vapor containing stream for a specific length of time. In all embodiments the nonporous layers formed are selectively permeable to hydrogen.

30 Claims, 10 Drawing Sheets

METHOD FOR FORMING H2-PERMSELECTIVE OXIDE MEMBRANES

ORIGIN OF THE INVENTION

This invention was made with Government support under Grant No. DE-FG22-92PC92525 and Contract No. DE-AC21- 90MC26365 awarded by the Department of Energy. The Government has certain rights in this invention.

RELATED U.S. APPLICATION

Continuation-in-Part of Ser. No. 07/960,154 filed Oct. 13, 1992, now abandoned, which was a Continuation-in-Part of Ser. No. 610,831 filed Nov. 8, 1990 now abandoned.

TECHNICAL FIELD

This invention relates to an improved method of fabrication of inorganic membranes for separation of gases at high temperatures; it is especially concerned with the chemical vapor deposition of layers of $SiO_2$, $B_2O_3$, $TiO_2$, $Al_2O_2$ and their mixtures within the pores of porous support tubes. The resulting membrane structures are highly selective to permeation of hydrogen and can be used for separation of hydrogen coupled with various hydrogen producing reactions such as the water-gas shift, hydrogen sulfide decomposition, and ethylbenzene dehydrogenation. The membrane can also be used for hydrogen separation at elevated temperatures in the absence of chemical reaction.

BACKGROUND OF THE INVENTION

The development of inorganic films or membranes which are selectively permeable to specific gases and are able to withstand the adverse environments encountered in most processes is becoming increasingly important. Such membranes must be stable at high temperatures and resistant to chemical attack to be suitable for use in a combined process involving a catalytic reaction and product separation. Through the use of such selective permeation membranes, the yield of catalytic processes which are currently restricted by thermodynamic equilibrium can be significantly improved.

In U.S. Pat. No. 4,902,307, in which one of the inventors is also one of the inventors of this invention, previous art concerning inorganic membranes is reviewed. U.S. Pat. No. 4,902,307 is hereby incorporated herein by reference. In U.S. Pat. No. 4,902,307, a technique, called the "opposing reactants deposition technique" for depositing internal $SiO_2$ layers within porous Vycor tubes ("sandwich configuration") is described. The deposition reaction set forth in the patent was the oxidation of silane ($SiH_4$). Briefly, that technique required the flow of one reactant, silane, inside the support tube, and the other reactant, oxygen, outside the support tube. The reactants diffuse in opposite directions and meet at some intermediate region within the tube wall where the film deposition reaction takes place. Once all the open pore paths are blocked by the deposited $SiO_2$, a barrier is formed which is highly selective to hydrogen permeation.

The thickness of the deposited film varies inversely with the reaction rate. Thus, increasing the temperature and the concentration of the reactants increases the reaction rate and results in thinner films. The practical temperature of $SiO_2$ deposition by oxidation of silane was found to be in the range of from 400° to 500° C. Below this range the reaction rate was too slow, and the deposition film too thick; above this range silane would decompose thermally throughout the porous substrate forming a thick layer of silicon of extremely low permeability to all gases, including hydrogen.

The $SiO_2$ films deposited at about 450° C. had hydrogen permeation rate coefficients of about 0.2 $cm^3/cm_2$-min-atm, and $H_2:N_2$ permeation rate ratios of about 3000, both measured at 450° C. immediately after deposition. Subsequent exposure to high temperatures, especially in the presence of water vapor, caused the permeability to hydrogen to decrease considerably. For example, heating at 600° C. for one day in the presence of water vapor decreased the permeation rate by a factor of 3, and heating at 700° C. for an additional day led to a further 30% drop of that rate. This undesirable decrease in permeability seems to be caused by densification of the $SiO_2$ film.

SUMMARY OF THE INVENTION

This invention is concerned with the formation of films of $SiO_2$, $B_2O_3$, $TiO_2$, $Al_2O_2$ and mixtures thereof. These are first formed as layers or films within the walls of a porous substrate tube by the hydrolysis of the respective halides (chlorides, bromides or iodides) by a one-sided flow deposition method or an alternating deposition method rather than by the opposing reactants deposition technique described in U.S. Pat. No. 4,902,307. In one embodiment of this invention, a $SiO_2$ layer is deposited by the reaction of silicon tetrachloride, $SiCl_4$, sometimes referred to as the first or halide reactant, with water vapor, sometimes referred to as the second reactant. In another embodiment of this invention, a $SiO_2$ layer is deposited by the reaction of the compound hexachlorodisiloxane or $Cl_3SiOSiCl_3$ with water vapor. In still another embodiment of this invention, a $SiO_2$ layer is deposited by the reaction of the compound octachlorotrisiloxane or $Cl_3SiOSiCl_2OSiCl_3$ with water vapor. The latter two silicon compounds react faster with the Vycor™ glass substrate, and form thinner $SiO_2$ layers which have higher diffusivities than silicon tetrachloride, $SiCl_4$. Vycor™ glass used herein is porous borosilicate glass with over 96% $SiO_2$, 3% $B_2O_3$, and smaller amounts of $Al_2O_3$, and other oxides. The mean pore diameter is in the range of 25Å to 120Å depending on the manufacturing conditions. The Vycor™ Brand Glass No. 7930 used in most of our experiments had mean pore diameter 40Å, internal diameter (ID) 5 mm, and external diameter (OD) 6.8 to 7.2 mm.

In yet another embodiment of this invention, a $SiO_2$ layer is deposited by the reaction of chlorosilanes, i.e. $SiH_xCl_{4-x}$ (x=1, 2 or 3) with a mixture of water vapor and oxygen.

The reaction between the first or halide reactant of this invention and the second reactant or water vapor to form the oxide deposit can take place in the gas phase outside of the porous tube wall and on the pore surface of the tube wall. Unfortunately, reactions in the gas phase produce particles which adhere to the tube wall. Such deposits form a relatively thick layer which decreases the membrane permeance and causes thermomechanical stresses that can result in cracks and membrane failure. This invention, therefore, is not directed to deposition on the outside or inside surface of the porous tube but rather inside the porous tube wall, i.e. in a thin region somewhere between the outside surface and the inside surface of the porous tube, which is referred to herein as the "pore surface". Therefore, this invention seeks to maximize oxide deposition on the pore surface and minimize oxide deposition on the external tube surface.

With the opposing reactants deposition technique of U.S. Pat. No. 4,902,307 it is possible to avoid the generation of particles in the gas phase and the formation of an external deposit. However, the pore surface deposits, i.e. internal deposits between the external outside surface and external inside surface of the tube, formed by the opposing reactant technique are relatively thick which is undesirable. In the one-sided flow deposition method we first found that the technique produces thinner and more permeable deposit layers and is, therefore, a significant improvement over the opposing reactants deposition technique. However, in the one-sided flow deposition method, particle formation in the gas phase cannot be completely avoided but can be greatly minimized by using low concentrations of reactants and carefully controlling the deposition time. We have also found that the reactants concentrations decrease in the flow direction parallel to the axis of the porous tube, from entry point to exit point, due to the chemical reaction. As a result, the deposit layer at the upstream section of the porous tube, i.e. at the point where the reactants first contact the porous tube section, is thicker than at the downstream section, i.e. at the point where the reactants last contact the porous tube section, which causes the resulting membrane permeance to be lower than it would be for a layer of uniform thickness. Accordingly, we have improved upon the one-sided deposition technique in another embodiment of this invention referred to herein as the "alternating flow deposition method". In the alternating flow deposition method the porous tube is first evacuated both on its inside and outside, the halide reactant, sometimes referred to as the first reactant, is then introduced over the inside or outside surface of the porous tube, and a period of time is allowed to lapse while the halide reactant enters and becomes grafted on the pore surface. In one embodiment, the halide partial pressure immediately after the introduction of the halide reactant stream along one of either the OD or ID of the porous tube is from about 0.01 to about 0.1 atm; and in another embodiment the halide partial pressure is from about 0.03 to about 0.06 atm.

The porous tube is then purged with an inert carrier gas, e.g. $N_2$ to remove the halide reactant from the space inside or outside of the porous tube. After purging is completed, water vapor is allowed to flow a predetermined period of time over the same surface of the porous tube as the halide reactant previously flowed and hydrolysis of the halide on the pore surface occurs. After a predetermined period of time hydrolysis is completed and the porous tube is again purged with an inert carrier gas. These steps are repeated a predetermined number of times until the desired permeation selectivity of the deposit layer has been achieved. In one embodiment, the steps are repeated until the $N_2$ permeation rate reaches a predetermined fraction of its initial permeation rate. In another embodiment, the steps are repeated until the $N_2$ permeation rate is decreased by a factor of between about 20 and about 500 of its initial permeation rate. In yet another embodiment, the steps are repeated until the $N_2$ permeation rate is decreased by a factor of between about 50 and about 100 of its initial permeation rate. In still another embodiment, the steps are repeated a predetermined number of times to achieve such results. In one embodiment, the steps are repeated from about 2 to about 100 times, and in another embodiment the steps are repeated from about 5 to about 25 times.

An important parameter in the alternating flow deposition method is the dosage of halide introduced into the evacuated porous tube per unit area of internal surface, i.e. the surface formed by the inside diameter of the tube. This dosage should be sufficiently small to limit the depth of penetration in the pores of porous tube segment thereby limiting the thickness of the ultimately formed oxide layer. The smaller the halide dosage in a cycle, the thinner and the more permeable the oxide membrane formed in the cycle. Also, the smaller the halide dosage per cycle, the larger the number of cycles required to obtain the desired permeation selectivity. However, the improvement in the membrane permeation coefficient diminishes and becomes insignificant when the dosage is decreased below a certain level. Control of the dosage is achieved by controlling the concentration of the halide flowed into the porous tube. In one embodiment, the dosage is from about 0.1 to about 1.0 $\mu mol/cm^2$ of OD or ID surface area of the porous tube section. In another embodiment, the dosage is from about 0.2 to about 0.4 $\mu mol/cm^2$ of OD or ID surface area of the porous tube section. The OD surface area is used if the halide reactant passes over the OD of the tube, and the ID surface area is used if the halide reactant passes over the ID of the tube.

Non-limiting examples of preferred porous support tubes are tubes made of Vycor™ Brand Glass No. 7930 and $Al_2O_3$.

BRIEF DESCRIPTION OF THE DRAWINGS

FIG. 11 shows the formation of two membranes differing by the dosage of the SiCl$_4$ per cycle.

DESCRIPTION OF THE PREFERRED EMBODIMENTS

Figure 1:
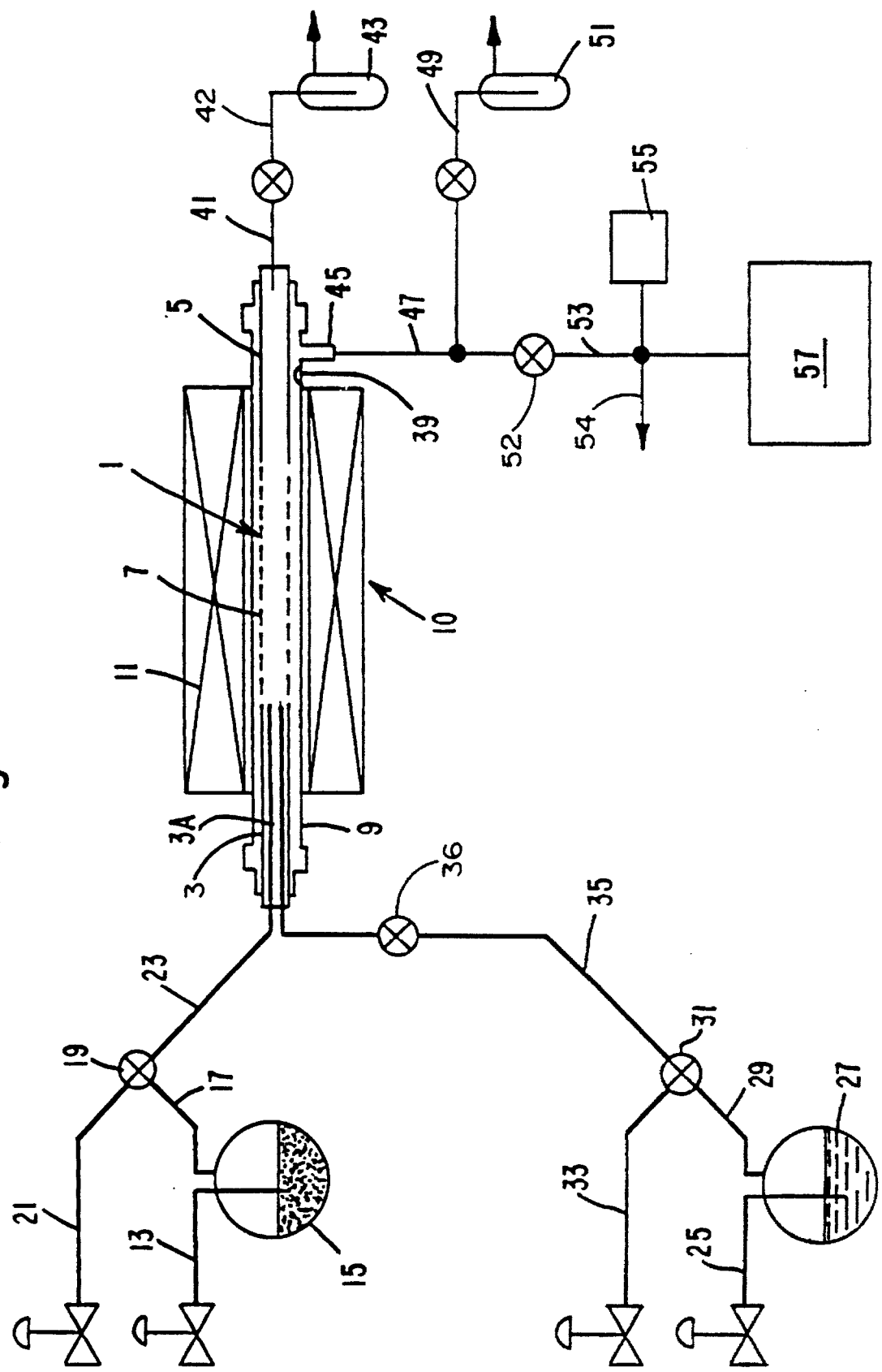
FIG. 1 is a schematic side view, partially cut away, of an apparatus used to deposit the oxide layer by the one-sided flow deposition method of this invention with the reactants entering on the inside, i.e. along the ID, of the porous tube.

Referring to the drawings wherein like numerals of reference designate like elements throughout, FIG. 1 shows schematically an apparatus 10 for depositing oxide layers within the walls of porous tube 1. Tube 1 has nonporous segments 3 and 5 at opposite ends and porous section 7 between segments 3 and 5. Tube 1 is surrounded by outer concentric, nonporous tube 9 of larger diameter, thus forming annulus 39. The concentric tubes 1 and 9 are placed in electrical furnace 11.

A halide reactant stream is generated by flowing an inert carrier gas like nitrogen though line 13 into bath 15 of controlled temperature containing liquid or solid halide. In the case of gaseous halides (e.g. BCl$_3$), bath 15 is replaced by a cylinder (not shown) containing compressed halide gas. The mol fraction of the halide in this stream is controlled by the temperature of bath 15 and the flow rate of nitrogen into bath 15 through line 13. The halide and nitrogen mixture flows through line 17 to valve 19 where it may be diluted with more inert gas from line 21. The mixture from valve 19 then passes through line 23 into the inside part, i.e. along the ID, of nonporous segment 3 of support tube 1.

A stream of water vapor having the desired mol fraction of water is generated by passing an inert carrier gas like nitrogen at a controlled flow rate through line 25 into water bath 27; bath 27 is maintained at a controlled temperature. This stream is introduced through line 29 into valve 31 where it may be diluted with more gas from line 33. The water vapor-inert gas mixture form valve 31 flows through line 35 into the inside part 3A, i.e. along the ID, of nonporous segment 3.

The mol fractions of halide in the halide stream and of water in the water stream can be varied considerably. Useful ranges of these mol fractions are 0.01–0.2 for the halide and 0.05–0.5 for the water streams.

The gases from inside tube 1 are conducted through line 41 to bath 43. The gases in annulus 39 leave through tube projection 45 and then through lines 47 and 49 to bath 51. Both baths 43 and 51 contain solutions of sodium hydroxide; unreacted halide is decomposed in the hydroxide, and hydrochloric, hydrobromic or hydrochloric acid, generated by hydrolysis of the halide, is neutralized. The outlet of annulus 39 can be alternatively connected through projection 45 and line 47 to vacuum line 53 and then to pressure gauge 55 or mass spectrometer 57.

Figure 2:
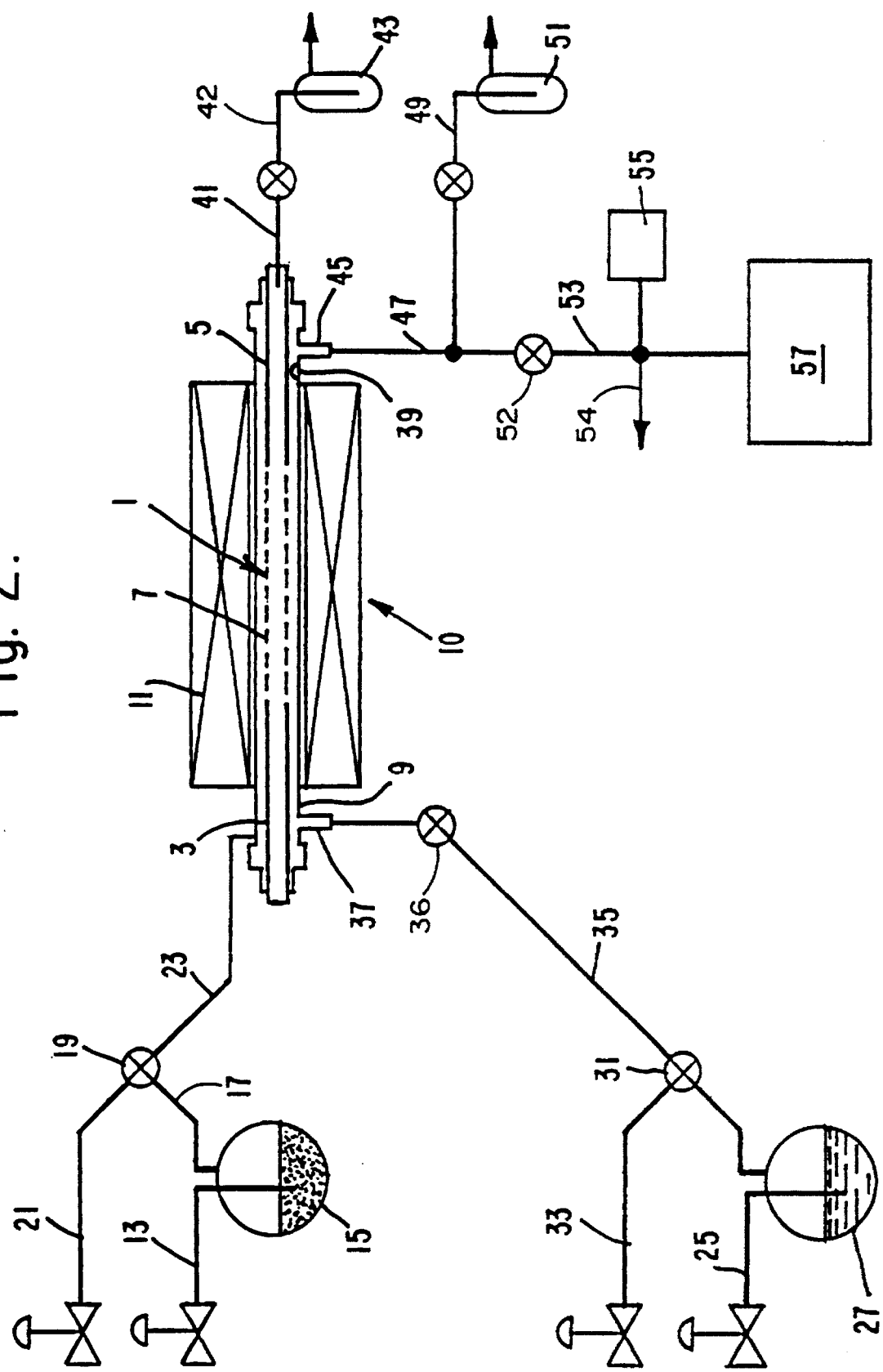
FIG. 2 is a schematic side view, partially cut away, of an apparatus used to deposit the oxide layer by the one-sided flow deposition method of this invention with the reactants entering on the outside, i.e. over the OD, of the porous tube.

In another embodiment, schematically illustrated in FIG. 2, the introduction of halide through line 23, and water vapor through line 35 and inlet 37, is into annulus 39 or over the OD of the porous segment 7 of porous tube 1. The various streams can be mixed, diverted, or cut off, as desired by various valves indicated in FIGS. 1 and 2 by the conventional valve symbol the encricled "X".

FIGS. 1 and 2 are schematic diagrams of apparatuses used for oxide deposition in the one-sided flow deposition method of this invention. The apparatus of FIG. 2 is identical to that of FIG. 1 except that the two reactant lines 23 and 35 are introduced outside nonporous segment 3 of support tube 1 rather than inside as in FIG. 1. In either arrangement the point of introduction should allow complete mixing before the reactants reach the beginning of porous section 7 of tube 1.

The composition and flow rate of the combined reactant stream must be chosen so that gas phase formation of oxide particles is prevented or minimized to a non-detrimental amount. This generally requires low partial pressures of chloride or high flow rates. The precise range of useful composition and residence times are interdependent and, in addition, depend on the temperature and the particular reaction employed.

Porous section 7 is preferably made of Vycor™ glass having an internal diameter of about 100 μm to about 5 mm, a wall thickness from about 20 μm to about 1 mm, and a mean pore diameter from about 10 Å to about 220 Å; or of Al$_2$O$_3$ with an internal diameter of about 0.5 mm to about 1 cm, a wall thickness from about 0.1 mm to about 2 mm, and a mean pore diameter from about 20 Å to about 1000 Å.

Figure 9:
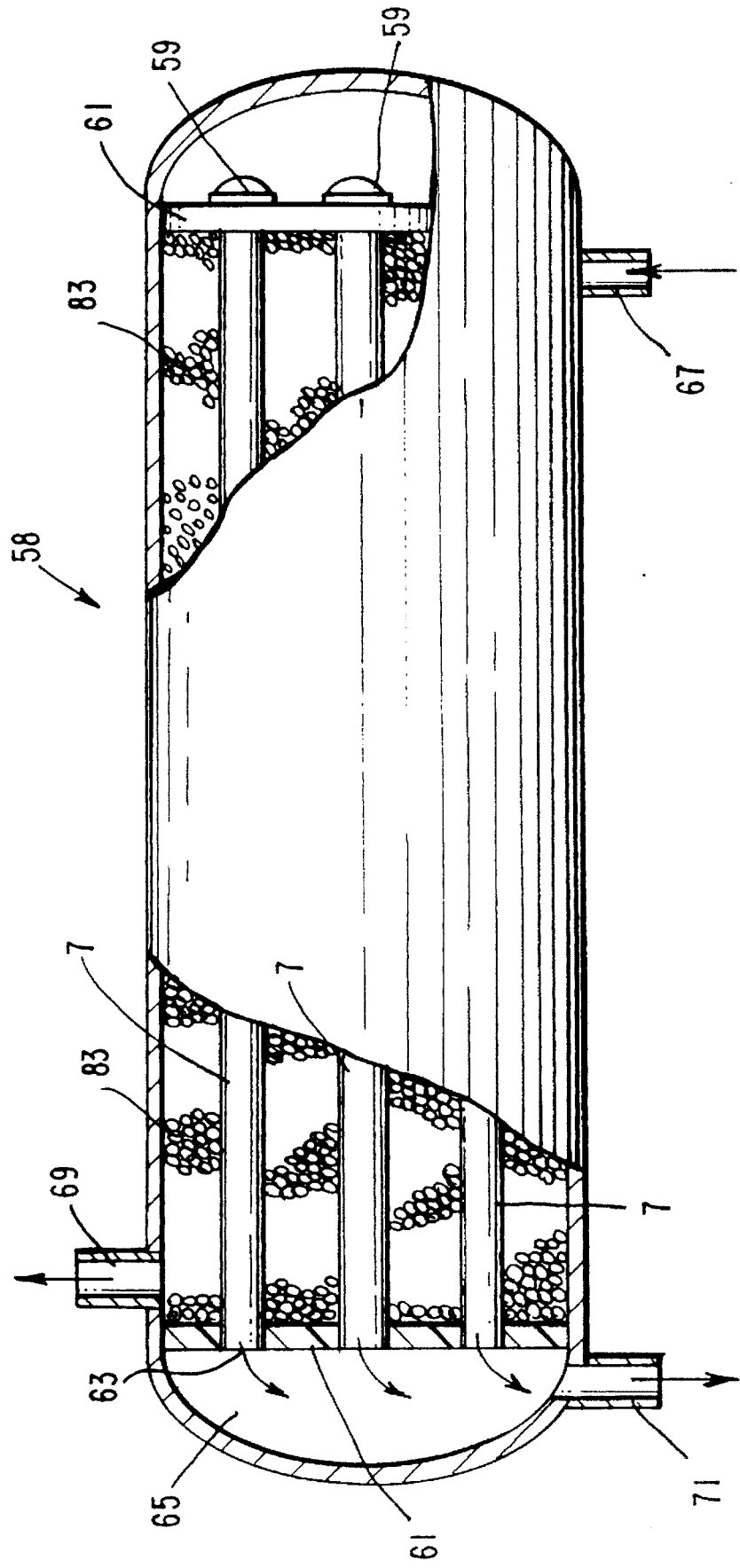
FIG. 9 is a side view, partially in cross-section, of an apparatus in which the hydrogen permselective oxide membranes of this invention may be used.

As shown in FIG. 9, multiple porous sections 7 can be mounted in cylinder 58 after one end of each section has been closed with cap 59 or in some other way. The second ends of section 7 are supported in plate 61 with openings 63 emptying into chamber 65. A gas mixture such as that obtained in the water-gas shift reaction, enters cylinder 58 through entry port 67. The gas mixture flows through a bed of catalyst particles 83 packed in the shell around the membrane sections 7 during which hydrogen passes through the oxide layer in the pores of the sections 7. The hydrogen gas passes out of the porous sections 7 through openings 63 into end chamber 65 and then through collection port 71. The flow of hydrogen can be facilitated by use of a vacuum pump (not shown) connected to collection port 71. The catalyst shown in FIG. 9 in the form of particles 83 can alternatively be placed within the pores of the membrane tubes by well known impregnation procedures.

Figure 10:
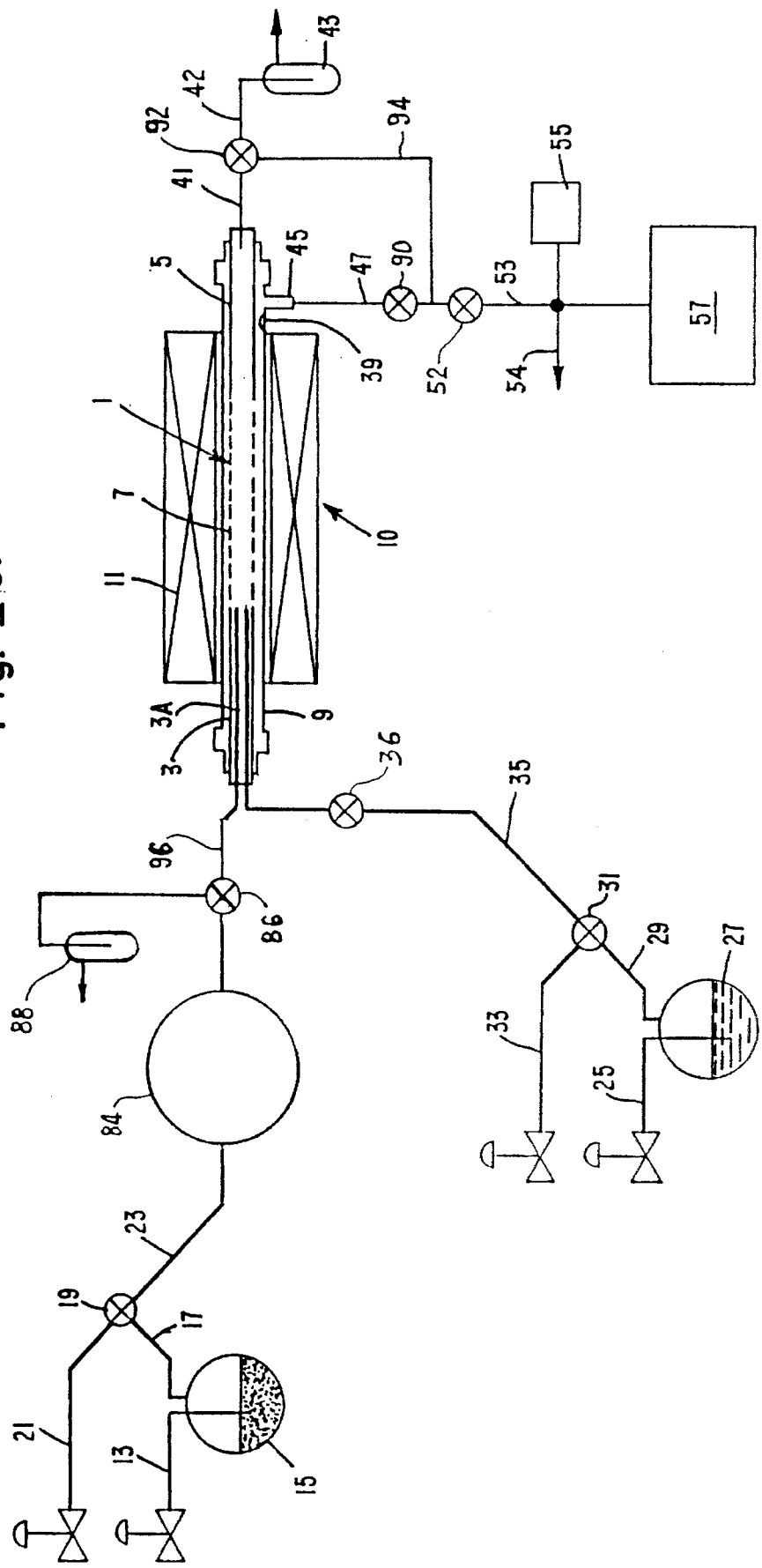
FIG. 10 is a schematic side view, partially cut away, of an apparatus used to deposit the oxide layer by the alternating flow deposition technique of this invention with the reactants entering alternatively through the inside, i.e. over the ID, of the porous tube.

FIG. 10 is a schematic diagram of another embodiment of our invention for an apparatus and method for oxide deposition by the alternating flow deposition method. The apparatus of FIG. 10 is similar to that of FIG. 1 except that line 23 contains storage vessel 84, three-way valve 86, and bath 88 which is connected to reactor tube segment 3, outlet line 47 contains valve 90, line 41 contains three-way valve 92, and by-pass line 94 has been added. Bath 88 is similar in design and operation to baths 43 and 51.

Deposition of oxide layers by the alternating flow deposition method requires a number of successive cycles during which the oxide is formed in discrete layers over spaced apart periods of times. Each cycle involves the following procedure. Unless stated otherwise, valves 36 and 52 are always open.

With valve 19 opened to flow from halide bath 15 to line 23, and with valve 86 opened to flow from storage vessel 84 to bath 88, storage vessel 84 is charged with a predetermined amount of the halide form bath 15. Valves 19 and 86 are then closed to all flow. With tube segment 7 evacuated, valve 86 is opened to flow from storage vessel 84 to line 96 for one or two seconds to fill the inside of tube segment 7 with halide-N$_2$ gas from storage vessel 84, and thereafter valve 86 is closed again to all flow. A few minutes is then allowed for the halide gas to enter and react with the pore surface of tube segment 7. With valves 31 and 86 closed to all flow therethrough, with valves 92 open between lines 41 and 94, and with valve 90 open, the inside and outside of porous tube segment 7 is evacuated through line 54 which is connected to a vacuum pump (not shown in the drawing).

Subsequently, tube segment 7 is purged with N$_2$ by opening valve 31 between lines 33 and 35, and by opening valve 92 between lines 41 and 42. After the $N_2$ purge is completed, valve 90 is closed to all flow, valve 92 is opened to flow between lines 41 and 42 and valve 31 is opened to flow between lines 29 and 35, thereby allowing a steady stream of water vapor from water bath 27 to flow into tube segment 7. During this period of time all halide on the pore surface of tube segment 7 is hydrolyzed and the resulting halide acid gas is neutralized in trap 43. Thereafter, in the final part of the cycle, tube segment 7 is again purged with pure $N_2$ carrier gas to remove all traces of water vapor. Tube segment 7 is now ready for the next cycle and the steps of (a) evacuation, (b) entry and grafting of halide on the pore surface, (c) evacuation, (d) $N_2$ purge, (e) hydrolysis of the halide on the pore surface, and (f) $N_2$ purge, are repeated a predetermined number of times until the desired hydrogen selectivity is obtained.

It has been noted, however, that an important parameter is the alternating flow deposition method is the dosage of halide, i.e. first reactant, introduced into evacuated tube segment 7 per unit area of internal surface, i.e. inside diameter surface, of the tube. The dosage should be sufficiently small to limit the depth of penetration in the pores of tube segment 7 thereby limiting the thickness of the ultimately formed oxide layer. The smaller the halide dosage in a cycle, the thinner and the more permeable the oxide membrane formed in the cycle. Also, the smaller the halide dosage per cycle, the larger the number of cycles required to produce a membrane of a certain thickness. The improvement in the permeation coefficient of the deposit layer diminishes and becomes insignificant when the dosage is decreased below a certain level. Control of the dosage is achieved by controlling the concentration of the halide in storage vessel 84. After a predetermined number of cycles, the halide in vessel 84 is replenished by flow from bubbler 15.

Figure 11:
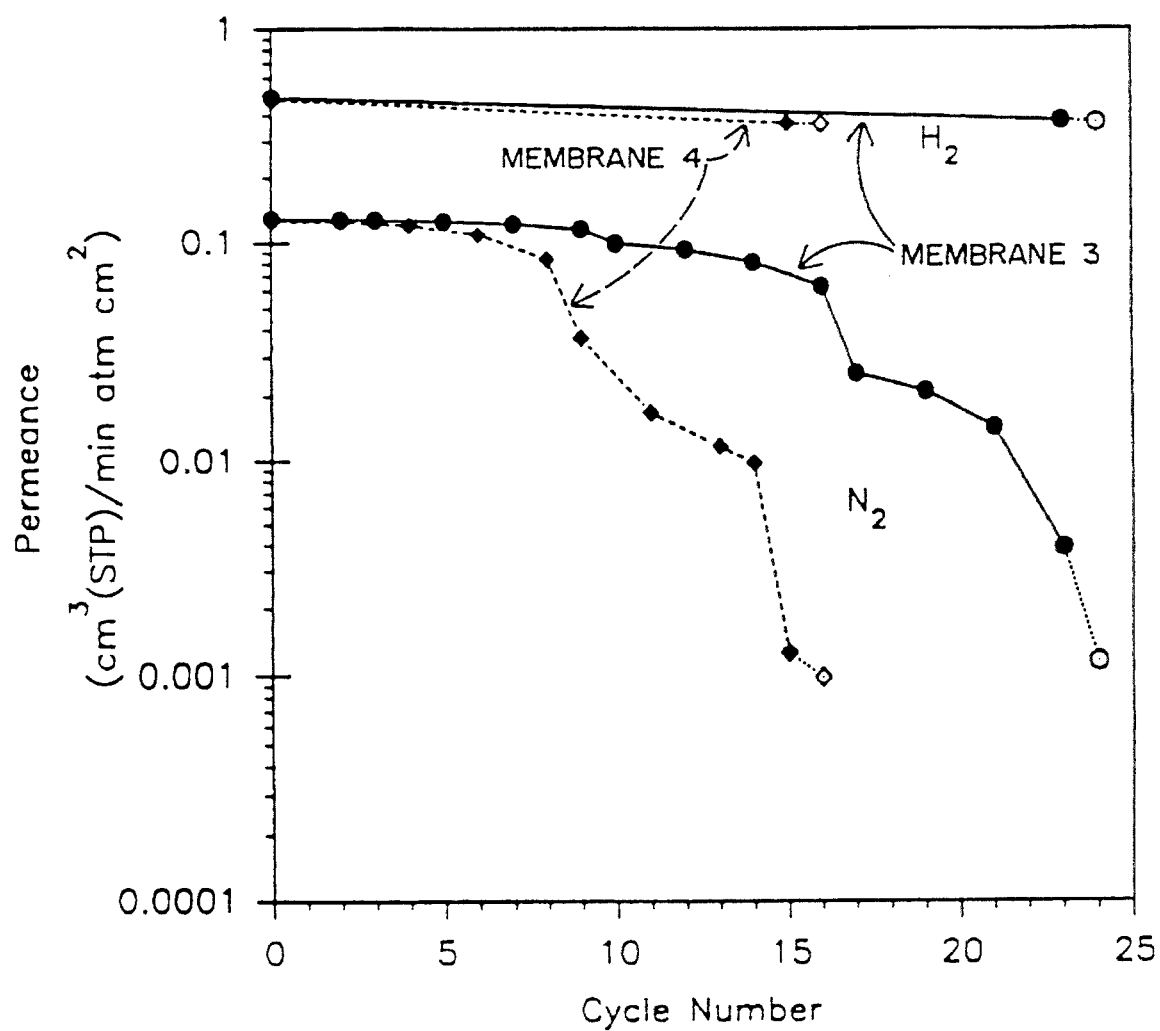
FIG. 11 illustrates the evolution of hydrogen and nitrogen permeation coefficients at 700° C. during successive cycles of alternating deposition of $SiO_2$ membranes at 700° C. by the alternating deposition technique.

FIG. 11 shows the permeances of $H_2$ and $N_2$ at 700° C. with membrane 3 and 800° C. with membrane 4 using $SiCl_4$ dosages of 0.28 μmol/cm² per cycle. The last data point of each curve indicates the permeance change after 5 days of hydrothermal treatment at 550° C. under 3 atm $H_2O$ and 7 atm of $N_2$.

EXAMPLE 1

Figure 3:
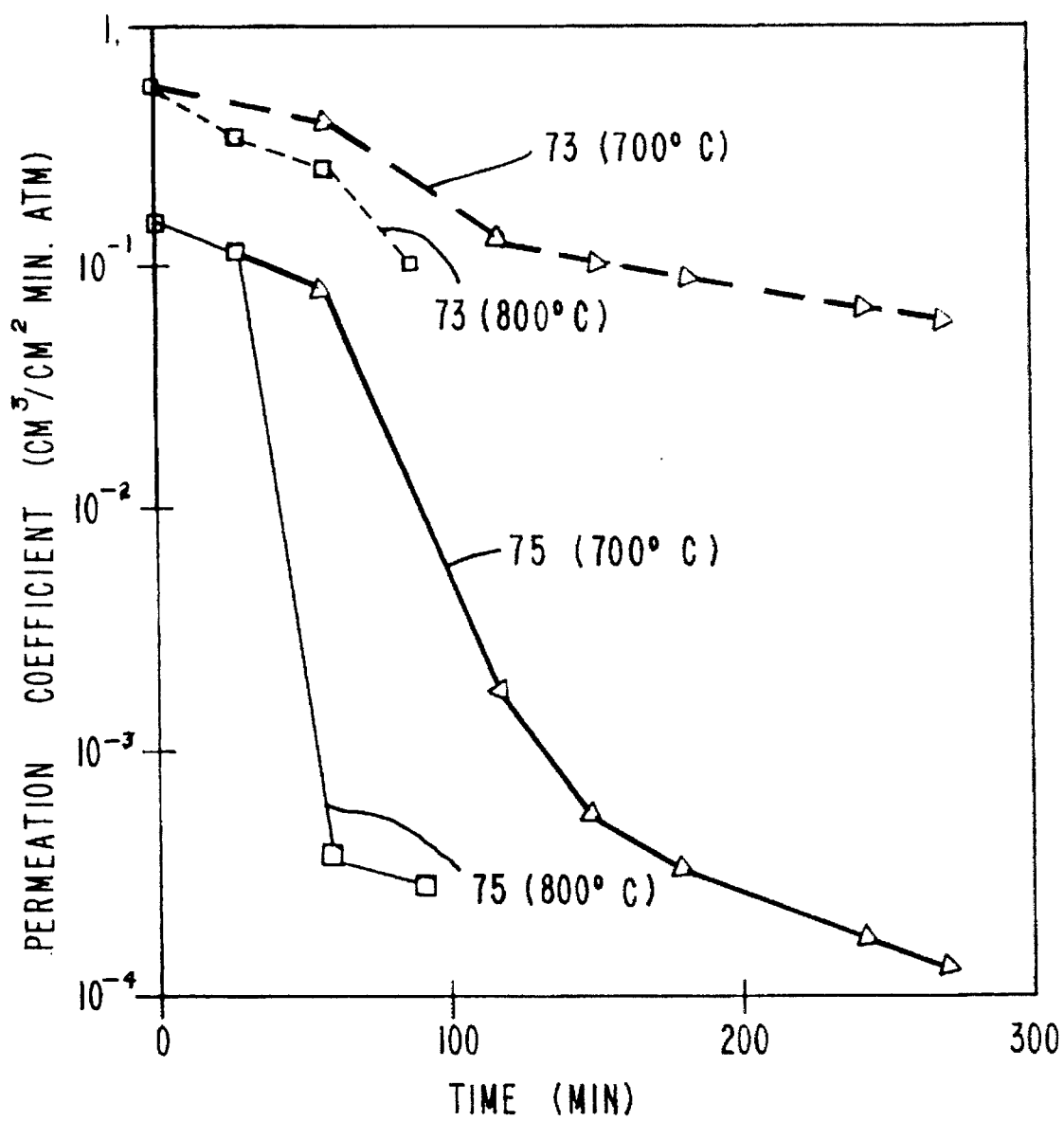
FIG. 3 is a graphic representation of the permeation rate coefficients of hydrogen and nitrogen versus time of deposition of a $SiO_2$ membrane at 700° and 800° C. by the opposing reactants deposition technique of U.S. Pat. No. 4,902,307.

Porous Vycor™ glass support tubes of 30 cm length, 5 m ID, 6.8 mm OD, 0.28 void fraction and 35 Å mean pore diameter were subjected to the deposition of $SiO_2$ layers in the opposing reactants deposition technique of U.S. Pat. No. 4,902,307. The two reactant streams were 30% $SiCl_4$—$N_2$ at 65 cm³/min flow rate and 7% $H_2O$—$N_2$ at 54 cm³/min flow rate. Depositions were carried out at 700° and 800° C. FIG. 3 shows the evolution of hydrogen 73 and nitrogen 75 permeation rates during deposition. At 800° C., after 100 minutes of deposition, the permeation coefficient of hydrogen at 450° C. was about 0.1 cm³/cm²-min-atm and that of nitrogen was smaller by a factor of 5000. The treated tube had become a highly selective membrane for hydrogen separation at high temperatures. To test its stability, the membrane was exposed to a mixture containing 22% $H_2$, 27% CO, 18% $CO_2$, 32% $H_2O$, and 1% $H_2S$ at 600° C. for ten days without measurable change in the $H_2$ and $N_2$ permeation rates.

EXAMPLE 2

Figure 4:
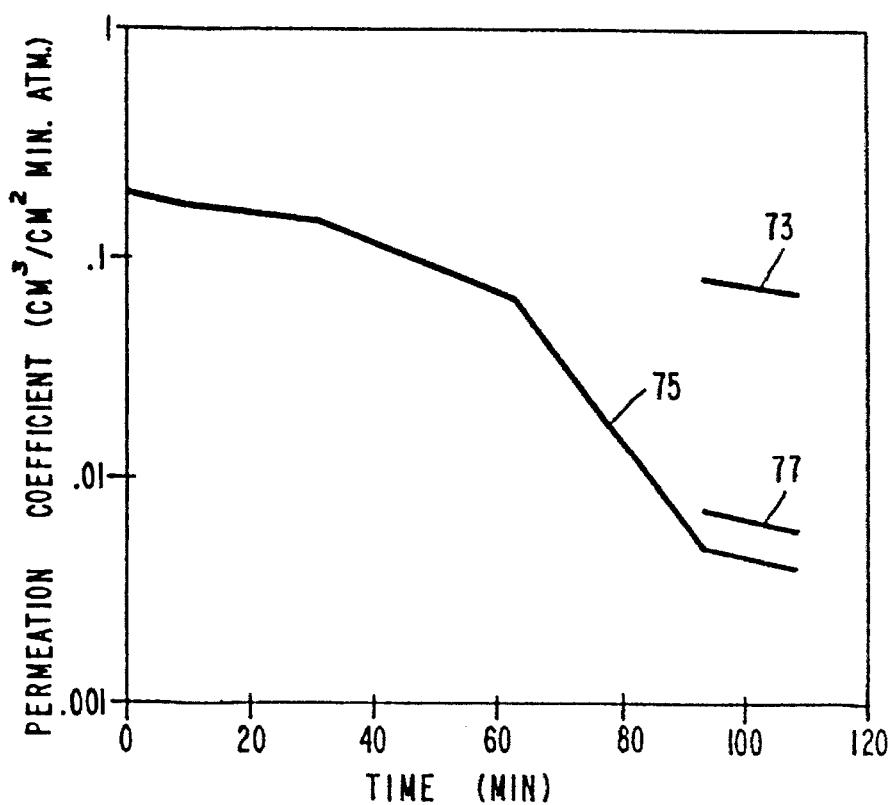
FIG. 4 is a graphic representation of the permeation coefficients of hydrogen, oxygen and nitrogen during deposition of $SiO_2$ film at 410° C. by the one-sided flow deposition method of this invention.
Figure 5:
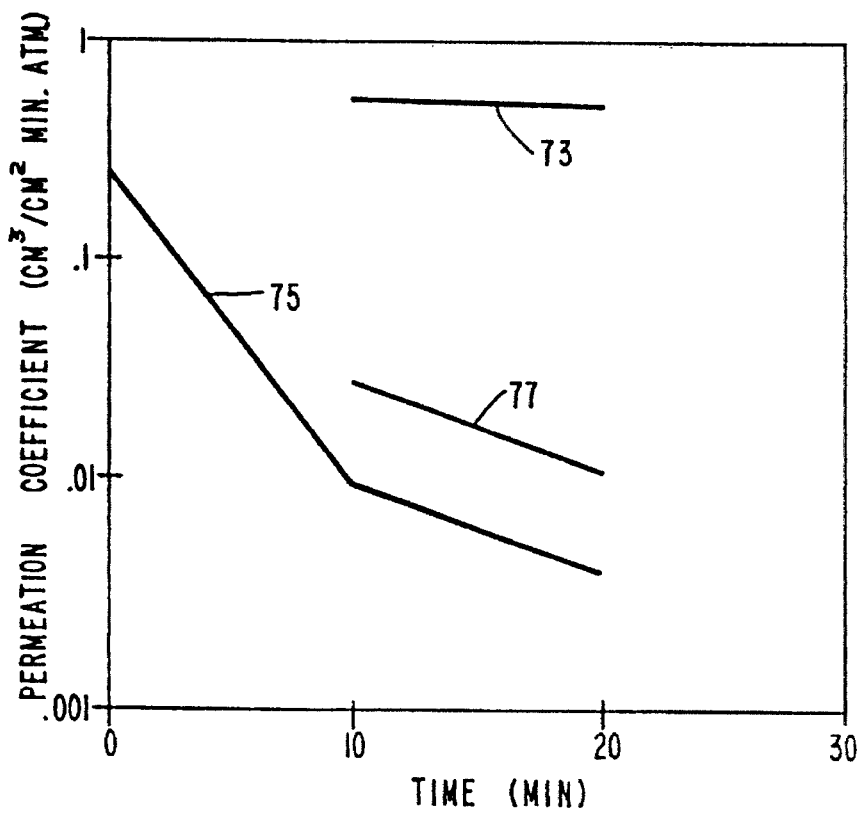
FIG. 5 is a graphic representation of the permeation coefficients of hydrogen, oxygen and nitrogen during deposition of $SiO_2$ film at 600° C. by the one-sided flow deposition method of this invention.

Porous Vycor™ glass support tubes with the same properties and dimensions as described in Example 1 were subjected to the deposition of $SiO_2$ layers using the one-sided flow deposition method of this invention. The two reactant streams of 30% $SiCl_4$—$N_2$ at 65 cm³/min flow rate and 8% $H_2O$—$N_2$ at 54 cm³/min flow rate were both introduced inside support tube 1, i.e. one-sided flow geometry, as shown in FIG. 1. Depositions were carried out at 410°, 600° and 800° C. FIG. 4 shows the permeation rates of hydrogen 73, oxygen 77 and nitrogen 75 during deposition at 410° C. FIG. 5 shows those permeation rates at 600° C. After 20 minutes deposition at 600° C., permeation coefficients at 450° C. were 0.28, $0.8 \times 10^{-4}$, and $0.3 \times 10^{-3}$ cm³/cm²-min-atm, for $H_2$, $N_2$ and $O_2$, respectively. It is to be noted that the hydrogen permeation rate is higher by a factor of about four than the permeation rate of the $SiO_2$ membrane prepared by deposition in the opposing reactants deposition technique of U.S. Pat. No. 4,902,307.

EXAMPLE 3

Figure 6:
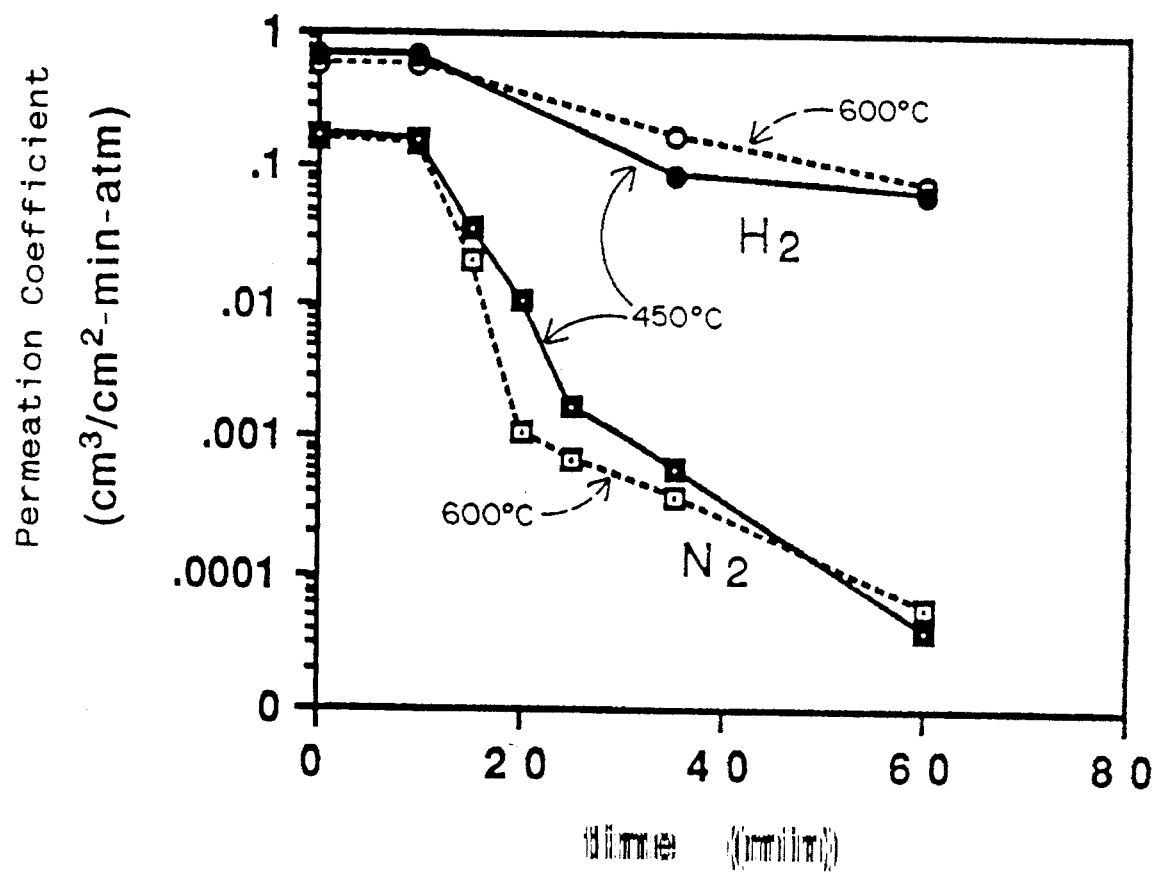
FIG. 6 illustrates the evolution of hydrogen and nitrogen permeation rates during deposition of $TiO_2$ films at 450° and 600° C. by the opposition reactants deposition technique.

Porous Vycor™ glass support tubes with the same properties and dimensions as described in Example 1 were subjected to the deposition of $TiO_2$ layers using the opposing reactants deposition technique. The two reactant streams of 20% $TiCl_4$—$N_2$ at 36 cm³/min flow rate; 12% $H_2O$—$N_2$ at 34 cm³/min flow rate. The permeation coefficients of $H_2$ and $N_2$ were measured during deposition with the results shown in FIG. 6. After 60 minutes of deposition at 450° C., the permeation coefficient of hydrogen at 450° C. was 0.07 cm³/cm²-min-atm and that of nitrogen was lower by a factor of 175. Approximately the same results were obtained after deposition at 600° C. Thus a titanium oxide layer lodged within the pores of the Vycor™ glass tube constitutes a hydrogen permselective oxide membrane. Higher permeation coefficients, however, are expected using the alternating flow deposition method of this invention.

EXAMPLE 4

Figure 7:
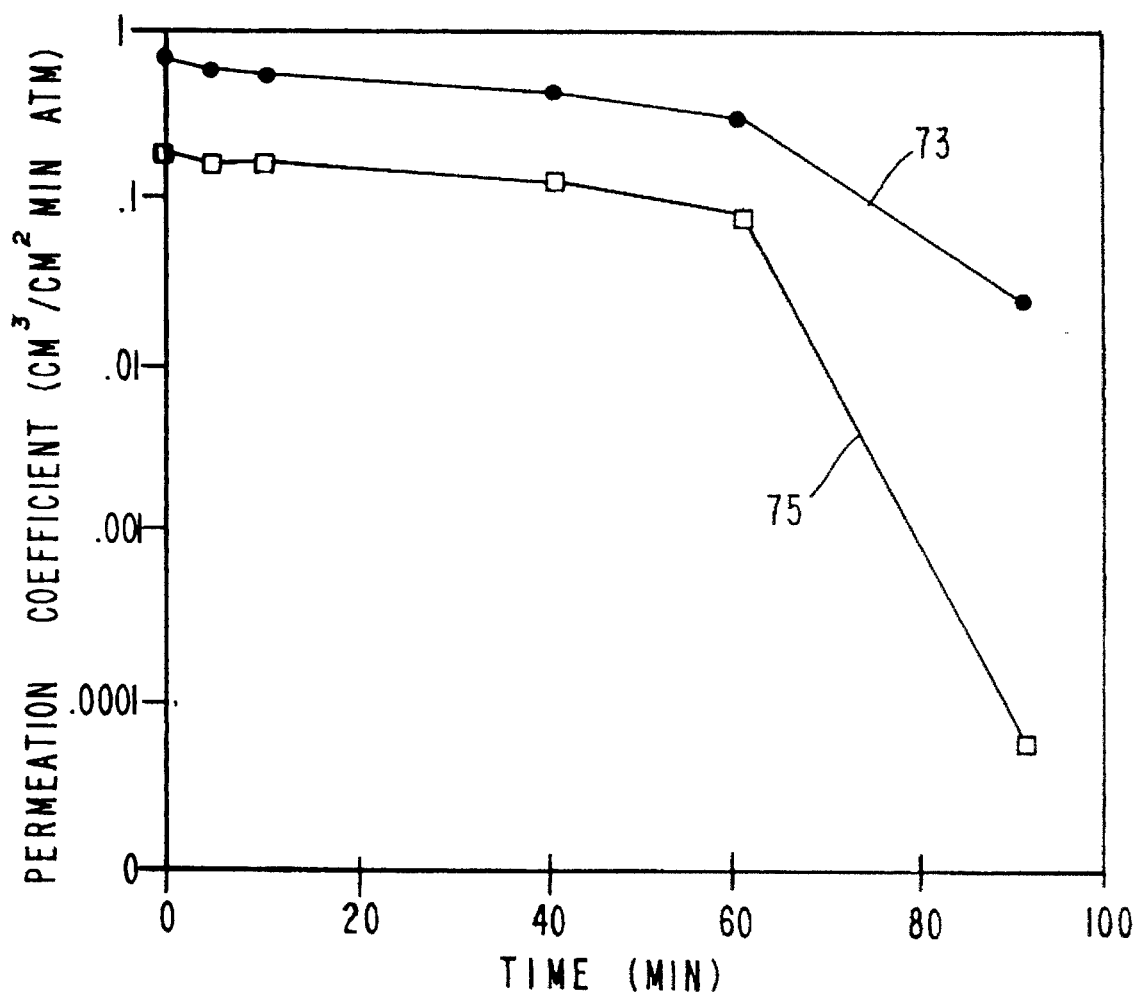
FIG. 7 illustrates the evolution of hydrogen and nitrogen permeation coefficients at 150° C. during deposition of a $B_2O_3$ membrane at 150° C. by the opposing reactants deposition technique.

Porous Vycor™ glass support tubes with the same properties and dimensions as described in Example 1 were subjected to the deposition of $B_2O_3$ layers using the opposing reactants deposition technique. The two reactant streams were 10% $BCl_3$—$N_2$ at 55 cm³/min flow rate, and 10% $H_2O$—$N_2$ at 55 cm³/min flow rate. The reaction temperature was 150° C. The permeation coefficients of $H_2$ and $N_2$ were measured during $B_2O_3$ deposition with the results shown in FIG. 7 as curves 73 and 75, respectively. After 90 minutes of deposition, the permeation coefficients of hydrogen and nitrogen were $2 \times 10^{-2}$ and $6 \times 10^{-5}$ cm³/cm²-min-atm, respectively. These permeation coefficients increased with temperature, and at 450° C. were 0.14 and 0.002 cm³/cm²-min-atm, respectively. Higher permeation coefficients, however, are expected using the one-sided flow or alternating deposition method of this invention.

EXAMPLE 5

Figure 8:
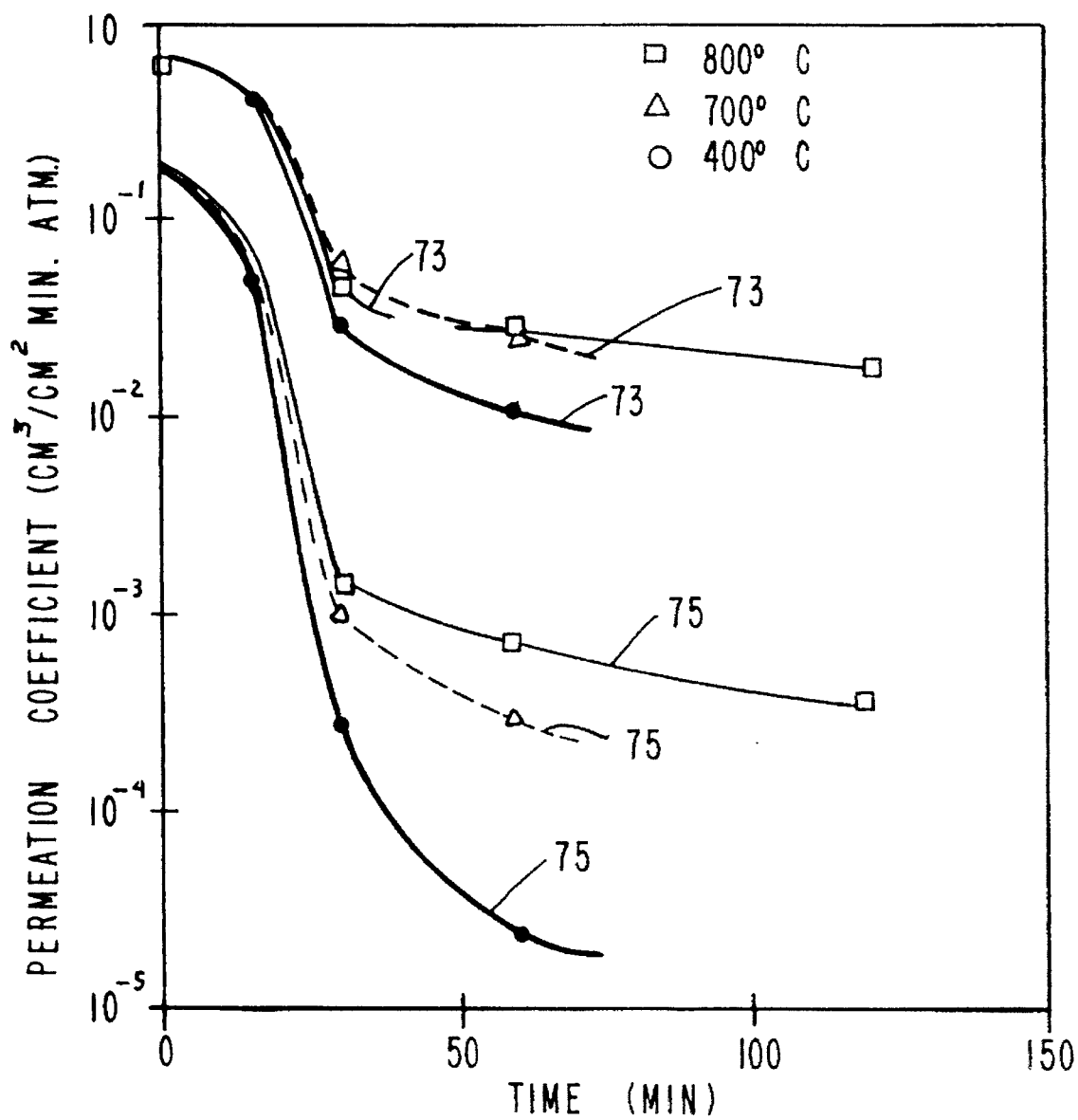
FIG. 8 illustrates permeation coefficients at 450° C. of hydrogen and nitrogen through $AlO_3$ membrane versus time of deposition at different temperatures. Deposition was carried out by the opposing reactants deposition technique.

Porous Vycor™ glass support tubes with the same properties and dimensions as described in Example 1 were subjected to the deposition of $Al_2O_3$ layers using the opposing reactants deposition technique. The two reactant streams were 20% $AlCl_3$—$N_2$ at 60 cm³/min flow rate, and 7% $H_2O$—$N_2$ at 54 cm³/min flow rate. Deposition runs were carried out at several temperatures. FIG. 8 shows the permeation coefficients of $H_2$ 73 and $N_2$ 75 at 450° C. through membranes prepared at 450° C., 700° C., and 800° C. After about 120 minutes of deposition the membranes possessed permeation coefficients of about $2\times10^{-2}$ cm$^3$/cm$^2$-min-atm for hydrogen. The permeation coefficients for nitrogen was less than $10^{-4}$ cm$^3$/cm$^2$-min-atm for the membrane prepared by deposition at 450° C., higher for the membranes prepared by deposition at 700° C. and 800° C. The lower separation ration of the membranes prepared at these higher temperatures may be due to crystallization of the $Al_2O_3$ deposit. Higher permeation coefficients, however, are expected using the alternating flow deposition method of this invention.

EXAMPLE 6

A porous Vycor™ glass support tube of 10 cm length, 5 mm ID, 5.7 mm OD, 0.28 void fraction and 25 Å mean pore diameter was subjected to the one-sided flow deposition method of this invention of a $SiO_2$ layer. Two reactant streams of 2% $Cl_3SiOSiCl_3$—$N_2$ at 10 cm$^3$/min flow rate and 35% $H_2O$—$N_2$ at 30 cm$^3$/min flow rate were both introduced inside the support tube. After 2.3 minutes of deposition at 700° C. and 12 hours heating under pure nitrogen at 700° C., the permeation coefficients at 450° C. were about 0.52 and 0.0013 cm$^3$/cm$^2$-min-atm for hydrogen and nitrogen, respectively. The hydrogen permeation coefficient is higher by about a factor of 2 than that of the membrane prepared as described in Example 2. The difference is due to the smaller pore size and wall thickness of the support tube as well as to the different silicon species used in the deposition.

EXAMPLE 7

Porous Vycor™ glass tubes of 10 cm length, 5 mm ID, 7.2 mm OD, 0.28 void fraction and 40 Å mean pore diameter were subjected to the deposition of $SiO_2$ layers by the alternating flow deposition method. The dosage of $SiCl_4$ in each cycle was 0.28 μmol/cm$^2$ in $N_2$ carrier and was allowed to react for 1 minute after which the tube was purged by $N_2$ flow for 5 minutes. Hydrolysis was then carried out for 5 minutes by a stream of 10% $H_2O$ in $N_2$ after which a 5 minute purge by pure $N_2$ was conducted to complete one cycle. In one experiment, the temperature throughout the cycle was kept at 700° C. After 23 cycles the permeation coefficients for $H_2$ and $N_2$ at 450° C. were 0.33 and 0.0019 cm$^3$/cm$^2$-min-atm, respectively.

In another experiment, the temperature throughout the cycle was kept at 800° C. After 16 cycles the $H_2$ and $N_2$ permeation coefficients at 450° C. were 0.28 and 0.00020 cm$^3$/cm$^2$/-min-atm, respectively. The membranes prepared at 700° C. and 800° C. are labelled as membranes 3 and 4, respectively, in the Table and FIG. 11. The Table and FIG. 11 show the permeance of membranes 3 and 4, both of which were prepared by the alternating flow deposition method, immediately after deposition and after three prolonged hydrothermal treatments to test membrane stability.

The silica membranes prepared by both the one-sided flow deposition method and the alternating flow deposition method, immediately after deposition had comparable hydrogen permeation coefficients. After prolonged heating in the presence of water vapor, the permeation coefficients of membranes produced by both methods declined, but the decline was less pronounced for the membranes prepared by the alternating flow deposition method. For example, after 14 days of heating at 550° C. in the presence of 3 atm of water vapor the hydrogen permeation coefficient at 450° C. of membranes prepared by the one-sided flow deposition method declined from about 0.3–0.4 to about 0.05–0.07 cm$^3$/cm$^2$-min-atm. Under the same conditions the hydrogen permeation coefficients of membranes prepared by the alternating flow deposition method declined from about 0.3 to about 0.2–0.23 cm$^3$/cm$^2$-min-atm. This difference is explained by the fact that the membranes prepared by the alternating flow deposition method are thinner but denser so that they undergo relatively lesser change during hydrothermal treatment. Whereas the membranes prepared by the one-sided flow deposition method are initially thicker but less dense and undergo more drastic changes during the hydrothermal treatment. In applications where the membrane must be used at high temperature and in the presence of considerable water partial pressure, the membranes prepared by the alternating flow deposition method are more useful because they maintain considerably higher hydrogen permeance.

While the preferred embodiments of the present invention have been described, it should be understood that various changes, adaptations and modifications may be made thereto without departing from the spirit of the invention and the scope of the appended claims. It should be understood, therefore, that the invention is not to be limited to minor details of the illustrated invention shown in preferred embodiments and the figures, and that variations in such minor details will be apparent to one skilled in the art.

Therefore it is to be understood that the present disclosure and embodiments of this invention described herein are for purposes of illustration and example and that modifications and improvements may be made thereto without departing from the spirit of the invention or from the scope of the claims. The claims, therefore, are to be accorded a range of equivalents commensurate in scope with the advances made over the art.

INDUSTRIAL APPLICABILITY

Porous tubes which contain layers of $SiO_2$, $B_2O_3$, $TiO_2$, $Al_2O_2$ and mixtures thereof are suitable for separation of $H_2$ from gas mixtures at temperatures from 300° to 800° C. They are particularly suited for separation of $H_2$ simultaneously with an equilibrium-limited catalytic reaction such as the water-gas shift reaction, the dissociation of hydrogen sulfide, and the dehydrogenation of ethylbenzene. The membranes containing $B_2O_3$ and $B_2O_3$—$SiO_2$ are suitable for separation of $H_2$, with or without simultaneous chemical reaction, at temperatures from 100° to 400° C.

TABLE $N_2$ and $H_2$ permeance of membranes deposited on the inner surface before and after hydrothermal treatments.

| | Reaction T | Measure-ment T | After deposition[1] ($cm^3$(STP)/min atm $cm^2$) | | after Treatment 1 | | after Treatment 2 | | after Treatment 3 | |
|---|---|---|---|---|---|---|---|---|---|---|
| | | | $N_2$ | $H_2$ | $N_2$ | $H_2$ | $N_2$ | $H_2$ | $N_2$ | $H_2$ |
| Membrane 3 | 700° C. | 700° C. | 0.0039 | 0.38 | 0.0011 | 0.37 | 0.00049 | 0.34 | 0.00042 | 0.33 |
| | | 600° C. | 0.0036 | 0.37 | 0.00073 | 0.35 | 0.0021 | 0.31 | 0.00015 | 0.30 |
| | | 450° C. | 0.0019 | 0.33 | 0.00041 | 0.29 | 0.00016 | 0.23 | 0.000094 | 0.21 |
| Membrane 4 | 800° C. | 800° C. | 0.0013 | 0.37 | 0.00099 | 0.37 | 0.00053 | 0.34 | 0.00033 | 0.34 |
| | | 600° C. | 0.00046 | 0.34 | 0.00038 | 0.33 | 0.00025 | 0.30 | 0.00018 | 0.28 |
| | | 450° C. | 0.00020 | 0.28 | 0.00026 | 0.27 | 0.00018 | 0.20 | 0.00015 | 0.19 |

[1]Deposition using 0.28 μmol/$cm^2$ of $SiCl_4$ per cycle.
Treatment 1: 5 days at 550° C. under 7 atm $N_2$ and 3 atm $H_2O$.
Treatment 2: 10 days at 550° C. under 7 atm $N_2$ and 3 atm $H_2O$.
Treatment 3: 15 at 550° C. under 7 atm $N_2$ and 3 atm $H_2O$.

What is claimed is:

1. A method for forming a permselective oxide membrane having hydrogen permselectivity comprising:

(a) forming a first reactant stream containing a first reactant of the formula $RX_n$ wherein R is silicon, titanium, boron or aluminum, X is chlorine, bromine or iodine, and n is a number which is equal to the valence of R;

(b) forming a second reactant stream containing water vapor;

(c) providing a porous tube having an outside surface and an inside surface which define a tube wall and pores extending between the outside surface and inside surface; and (d) passing both the first and the second reactant streams along one of either the outside of the inside surface, but not both surfaces, of the porous tube and causing said reactant streams to react in the pores of the porous tube to form a nonporous layer of R-oxide in the pores of the porous tube, said nonporous layer being selectively permeable to hydrogen.

2. The method of claim 1, wherein the porous tube has a porosity, and the pores of the porous tube have a diameter, wherein the diameter of the pores of the porous tube are too small for entry of particles of condensed oxides of R, and further comprising minimizing reduction of the porosity of the porous tube outside of the nonporous layer of R-oxide, and minimizing formation of R-oxide particles in the reactant streams outside of the tube wall and on the outside surface and inside surface of the porous tube.

3. The method of claim 1, wherein the first and second reactant streams are both introduced into one end of the porous tube.

4. The method of claim 1, wherein the first and second reactant streams are both along the outside surface of the porous tube.

5. The method of claim 1, wherein X is Cl.

6. The method of claim 1, wherein X is Br.

7. The method of claim 1, wherein X is I.

8. The method of claim 1, wherein R is Si and the two streams react at a temperature between about 400° C. and about 800° C.

9. The method of claim 1, wherein R is B and the two streams react at a temperature between about 100° C. and about 450° C.

10. The method of claim 1, wherein R is Al and the two streams react at a temperature between about 400° C. and about 700° C.

11. The method of claim 1, wherein R is Ti and the two streams react at a temperature between about 300° C. and about 600° C.

12. A method for forming a permselective oxide membrane having hydrogen permselectivity comprising:

(a) forming a first reactant stream containing a first reactant of the formula $SiH_nCl_{4-n}$ wherein n is 1, 2 or 3;

(b) forming a second reactant stream containing water vapor and oxygen;

(c) providing a porous tube having an outside surface and an inside surface which define a tube wall and pores extending between the outside surface and inside surface; and (d) passing both the first and the second reactant streams along one of either the outside or the inside surface, but not both surfaces, of the porous tube and causing said reactant streams to react in the pores of the porous tube to form a nonporous layer of silicon oxide in the pores of the porous tube, said nonporous layer being selectively permeable to hydrogen.

13. A method of forming a permselective oxide membrane having hydrogen permselectivity comprising:

(a) forming a first reactant stream containing a first reactant selected from the group consisting of $Cl_3SiOSiCl_3$, $Cl_3SiOSiCl_2OSiCl_3$, and mixtures thereof:

(b) forming a second reactant stream containing water vapor;

(c) providing a porous tube having an outside surface and an inside surface which define a tube wall and pores extending between the outside surface and inside surface; and (d) passing both the first and the second reactant streams along one of either the outside or the inside surface, but not both surfaces, of the porous tube and causing said reactant streams to react in the pores of the porous tube to form a nonporous layer of silicon oxide in the pores of the porous tube, said nonporous layer being selectively permeable to hydrogen.

14. A method for forming a permselective oxide membrane having hydrogen permselectivity comprising:

(a) forming a first reactant stream containing a first reactant of the formula $RX_n$ where in R is silicon, titanium, boron or aluminum, X is chlorine, bromine or iodine, and n is a number which is equal to the valence of R;

(b) forming a second reactant stream containing water vapor as a second reactant;

(c) providing a porous tube having an outside surface and an inside surface which define a tube wall and pores extending between the outside surface and inside surface;

(d) introducing an amount of the first reactant stream along one of either the outside or the inside surface of the porous tube and allowing a length of time for the first reactant to enter and react in the pores of the porous tube;

(e) removing the first reactant which has not entered and reacted in the pores, form the surface of the porous tube along which the first reactant stream was introduced;

(f) introducing the second reactant stream along one of either the outside or the inside surface of the porous tube and allowing the second reactant to react in the pores of the porous tube with the first reactant;

(g) stopping the introducing of the second reactant along said one of either the outside or the inside surface; and (h) removing the second reactant which has not entered and reacted in the pores form the surface of the porous tube along which the second reactant stream was introduced.

15. The method of claim 14, wherein the introducing of the first reactant stream along said one of either the outside or the inside surface uses a first reactant dosage between about 0.1 to about 1.0 µmol/cm² of surface area of said one of either the outside or the inside surface.

16. The method of claim 14, wherein the first reactant has a partial pressure, and wherein the partial pressure of the first reactant immediately after introducing it along one of either the outside or the inside surface of the porous tube is from about 0.01 to about 0.1 atm.

17. The method of claim 14, further comprising repeating the steps of:

introducing the amount of the first reactant stream along said one of either the outside or the inside surface and allowing a length of time for the first reactant to enter and react in the pores of the porous tube, removing the first reactant which has not entered and reacted in the pores from the surface of the porous tube along which the first reactant stream was introduced, introducing the second reactant stream along said one of either the ouside or inside surface and allowing the second reactant to react in the pores of the porous tube with the first reactant, stopping the introducing of the second reactant stream along said one of either the outside or the inside surface, and removing the second reactant which has not entered and reactant in the pores from the surface of the porous tube along which the second reactant stream was introduced, a number of times to form a permselective oxide membrane having a hydrogen permselectivity.

18. The method of claim 17, wherein the number of times the steps are repeated is from about 2 to about 100 times.

19. The method of claim 14, wherein the first and second reactant streams are introduced into one end of the porous tube.

20. The method of claim 14, wherein the first and second reactant streams are introduced along the outside surface of the porous tube.

21. The method of claim 14, wherein X is Cl.

22. The method of claim 14, wherein X is Br.

23. The method of claim 14, wherein X is I.

24. The method of claim 14, wherein R is Si and the reactants react at a temperature between about 400° C. and about 800° C.

25. The method of claim 14, wherein R is B and the reactants react at a temperature between about 100° C. and about 450° C.

26. The method of claim 14, wherein R is Al and the reactants react at a temperature between about 400° C. and about 700° C.

27. The method of claim 14, wherein R is Ti and the reactants react at a temperature between about 300° C. and about 600° C.

28. A method for forming a permselective oxide membrane having hydrogen permselectivity comprising:

(a) forming a first reactant stream containing a first reactant of the formula $RX_n$ wherein R is silicon, titanium, boron or aluminum, X is chlorine, bromine or iodine, and n is a number which is equal to the valence of R;

(b) forming a second reactant stream containing water vapor as a second reactant;

(c) providing a porous tube having an outside surface and an inside surface which define a tube wall and pores extending between the outside surface and inside surface;

(d) introducing an amount of the first reactant stream along one of either the outside or the inside surface, but not both surfaces, of the porous tube and allowing a length of time for the first reactant to enter and react in the pores of the porous tube;

(e) removing the first reactant which has not entered and reacted in the pores, from said one of either the outside or the inside surface;

(f) introducing the second reactant stream along said one of either the outside or inside surface of the porous tube and allowing the second reactant to react in the pores of the porous tube with the first reactant to form a nonporous layer of R-oxide in the pores of the porous tube, the nonporous layer being selectively permeable to hydrogen;

(g) stopping the introducing of the second reactant along said one of either the outside or the inside surface; and (h) removing the second reactant which has not entered and reacted in the pores form the surface of the porous tube along which the second reactant stream was introduced.

29. A method for forming a permselective oxide membrane having hydrogen permselectivity comprising:

(a) forming a first reactant stream containing a first reactant of the formula $SiH_nCl_{4-n}$ wherein n is 1, 2 or 3;

(b) forming a second reactant stream containing water vapor and oxygen as a second reactant;

(c) providing a porous tube having an outside surface and an inside surface which define a tube wall and pores extending between the outside surface and inside surface; and (d) introducing an amount of the first reactant stream along one of either the outside or the inside surface, but not both surfaces, of the porous tube and allowing a length of time for the first reactant to enter and react in the pores of the porous tube;

(e) removing the first reactant which has not entered and reacted in the pores, from said one of either the outside or the inside surface;

(f) introducing the second reactant stream along said one of either outside or the inside surface of the porous tube and allowing the second reactant to react in the pores of the porous tube with the first reactant to form a nonporous layer of silicon oxide in the pores of the porous tube, the nonporous layer being selectively permeable to hydrogen;

(g) stopping the introducing of the second reactant along said one of either the outside or the inside surface; and (h) removing the second reactant which has not entered and reacted in the pores form the surface of the porous tube along which the second reactant stream was introduced.

30. A method for forming a permselective oxide membrane having hydrogen permselectivity comprising:

(a) forming a first reactant stream containing a first reactant selected from the group consisting of $Cl_3SiOSiCl_3$, $Cl_3SiOSiCl_2OSiCl_3$, and mixtures thereof;

(b) forming a second reactant stream containing water vapor as a second reactant;

(c) providing a porous tube having an outside surface and an inside surface which define a tube wall and pores extending between the outside surface and inside surface; and (d) introducing an amount of the first reactant stream along one of either the outside or the inside surface, but not both surfaces, of the porous tube and allowing a length of time for the first reactant to enter and react in the pores of the porous tube;

(e) removing the first reactant which has not entered and reacted in the pores, from said one of either the outside or the inside surface;

(f) introducing the second reactant stream along said one of either the outside or inside surface of the porous tube and allowing the second reactant to react in the pores of the porous tube with the first reactant to form a nonporous layer of silicon oxide in the pores of the porous tube, the nonporous layer being selectively permeable to hydrogen;

(g) stopping the introducing of the second reactant along said one of either the outside or the inside surface; and (h) removing the second reactant which has not entered and reacted in the pores form the surface of the porous tube along which the second reactant stream was introduced.

* * * * *